United States Patent
Lin et al.

(10) Patent No.: US 7,517,746 B2
(45) Date of Patent: Apr. 14, 2009

(54) METAL OXIDE SEMICONDUCTOR TRANSISTOR WITH Y SHAPE METAL GATE AND FABRICATING METHOD THEREOF

(75) Inventors: Chin-Hsiang Lin, Hsin-Chu (TW); Chia-Jung Hsu, Changhua County (TW); Li-Wei Cheng, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 142 days.

(21) Appl. No.: 11/739,111

(22) Filed: Apr. 24, 2007

(65) Prior Publication Data

US 2008/0265322 A1     Oct. 30, 2008

(51) Int. Cl.
H01L 21/336 (2006.01)
H01L 21/8234 (2006.01)
H01L 21/4763 (2006.01)

(52) U.S. Cl. .............. 438/197; 438/585; 438/589; 257/E21.409; 257/E21.419; 257/E21.428; 257/E21.429

(58) Field of Classification Search .......... 257/E21.409, 257/E21.419, E21.428, E21.429
See application file for complete search history.

(56) References Cited

U.S. PATENT DOCUMENTS

| | | | | |
|---|---|---|---|---|
| 4,889,827 A | * | 12/1989 | Willer | 438/180 |
| 6,222,210 B1 | * | 4/2001 | Cerny et al. | 257/194 |
| 6,383,876 B1 | * | 5/2002 | Son et al. | 438/289 |
| 6,936,508 B2 | | 8/2005 | Visokay et al. | |
| 6,953,719 B2 | | 10/2005 | Doczy et al. | |
| 6,960,515 B2 | | 11/2005 | Cho et al. | |
| 2007/0057288 A1 | * | 3/2007 | Kim et al. | 257/192 |

* cited by examiner

*Primary Examiner*—Walter L Lindsay, Jr.
*Assistant Examiner*—Mohsen Ahmadi
(74) *Attorney, Agent, or Firm*—Winston Hsu

(57) ABSTRACT

A method of manufacturing a metal oxide semiconductor transistor having a metal gate is provided. The method firstly includes a step of providing a substrate. A dummy gate is formed on the substrate, a spacer is formed around the dummy gate, and doped regions are formed in the substrate outside of the dummy gate. A bevel edge is formed on the spacer, and a trench is formed in the inner sidewall of the spacer. A barrier layer, and a metal gate are formed in the trench and on the bevel edge, and the barrier layer will not form poor step coverage.

16 Claims, 12 Drawing Sheets

METAL OXIDE SEMICONDUCTOR TRANSISTOR WITH Y SHAPE METAL GATE AND FABRICATING METHOD THEREOF

BACKGROUND OF THE INVENTION

1. Field of the Invention

The present invention relates to a method of manufacturing a metal oxide semiconductor (MOS) transistor, and more particularly to a method of manufacturing a metal oxide semiconductor transistor with a Y structure metal gate.

2. Description of the Prior Art

As semiconductor technology improves, 45 nm semiconductor devices are now being manufactured. Current metal-oxide-semiconductor field-effect transistors (MOSFETs) often utilize poly-silicon to make a gate. A doped poly-silicon gate has problems, however, such as a depletion effect of the poly-silicon gate, and boron penetrates through a channel.

Take the depletion effect of the poly-silicon gate as an example. When the poly-silicon gate is in an inversion, carrier depletion occurs between the poly-silicon gate and the gate dielectric layer. If this poly-silicon gate has the afore-mentioned depletion effect, the effect of the gate capacitance will decrease, but a high quality metal oxide semiconductor transistor should have a high gate capacitance. If the gate capacitance is high, more electric charge will accumulate in two sides of the gate capacitance. More electric charge therefore accumulates in the channel, so when the metal oxide semiconductor transistor has a bias voltage, the speed of the electric current between the source/drain will be improved.

Please refer to FIG. 1A. FIG. 1A is a schematic diagram, which illustrates the metal oxide semiconductor transistor having a depletion effect. A substrate 10 has a gate structure 12 thereof in FIG. 1A. A gate dielectric layer 15 is positioned between the gate structure 12 and the substrate 10. The source/drain 14 are in the two sides of the gate structure 12 in the substrate 10. Around the gate structure 12 is a spacer 16. The gate structure 12, the source/drain 14 form the metal oxide semiconductor transistor 18. The gate structure 12 is made from poly-silicon. When the metal oxide semiconductor transistor 18 has a depletion effect, carrier charges will accumulate between the gate structure 12 and the gate dielectric layer 15. Therefore, the thickness of the equivalent gate dielectric layer increases, while the gate capacitance decreases. The total capacitance decreases, and the drive effect of the metal oxide semiconductor transistor is reduced.

To avoid the above-mentioned depletion effect of the poly-silicon gate, the current industry utilizes a metal gate to replace the poly-silicon gate. A so-called replacement metal gate approach is processed with a dummy poly-silicon gate is formed first, and the dummy poly-silicon gate is then removed to form a recess. A metal gate is formed in the recess. Furthermore, a barrier layer and a High-k material layer are formed between the metal gate and the substrate to avoid the leakage of the gate structure and to increase the flexibility of the process. This structure is usually utilized in technology generation equal to or less than 45 nm to decrease the depletion effect of the poly-silicon. Since the source/drain 14 implantation and activation processes have been processed prior to the metal gate formation, the less thermal budget concern of the replacement metal gate could be achieved.

Before the metal fills the recess in the replacement gate process, a barrier layer must be deposited on the inner sidewalls of the recess. The depth/width (L/W) ratio of the recess is too high due to the narrow channel length, so the barrier layer is easy to form poor step coverage in the recess inner sidewall and would cause overhang effect on top of the recess as referred to FIG. 1B. The recess opening becomes smaller with the overhang formation, and the metal filling step is easy to form void in the recess as shown in FIG. 1C. The poor step coverage and the void formed after metal gate process would cause the issues such as the work function deviation and the chemical damage during planarity process. Therefore, to manufacture a metal oxide semiconductor transistor with no poor barrier layer step coverage is an important issue in the semiconductor industry.

SUMMARY OF THE INVENTION

The purpose of the present invention is to provide a metal oxide semiconductor transistor with a Y structure metal gate and manufacturing method thereof to solve the above-mentioned problems.

According to the claimed present invention, a method of manufacturing a metal oxide semiconductor transistor with a Y shape metal gate is provided. The method includes providing a substrate, a gate temporary layer being formed on the substrate, and a spacer being around the gate temporary layer, where each side of the gate temporary layer has a doping region in the substrate. Then, an insulating layer, and a dielectric layer are formed on the gate temporary layer, the spacer, and the substrate in sequence. The partial dielectric layer is removed to expose the insulating layer. The insulating layer on the gate temporary layer and the gate temporary layer are removed to form a bevel edge covering the spacer, and a recess inside the spacer. A barrier layer is formed in the inner sidewall of the recess, and on the bevel edge and the remaining dielectric layer. A conductive layer is sequentially formed on the barrier layer. The barrier layer and the conductive layer are formed on the inner sidewall of the recess to form a metal gate.

According to the claimed present invention, a metal oxide semiconductor (MOS) transistor with a Y structure metal gate is provided. The MOS transistor includes a substrate, a Y structure metal gate positioned on the substrate, two doping regions disposed in the substrate on two sides of the Y structure metal structure, a spacer, an insulating layer positioned outside the spacer, a dielectric layer positioned outside the insulating layer and a bevel edge covering the spacer. The spacer has a vertical sidewall, and the vertical sidewall surrounds a recess. A part of the Y structure metal gate is disposed in the recess, and a part of the Y structure metal gate is positioned on the bevel edge.

When the barrier layer of the present invention fills into the recess, the barrier layer will not have poor step coverage, because the recess with wider opening has the bevel edge and the depth/width is less than in the prior art. Moreover, the metal gate is formed completely without void into the recess for manufacturing a good quality metal oxide semiconductor transistor with a metal gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A to 1C are schematic diagrams that illustrate the conventional metal oxide semiconductor transistor of metal gate having a overhang and a void effects.

DETAILED DESCRIPTION

Figure 1A:
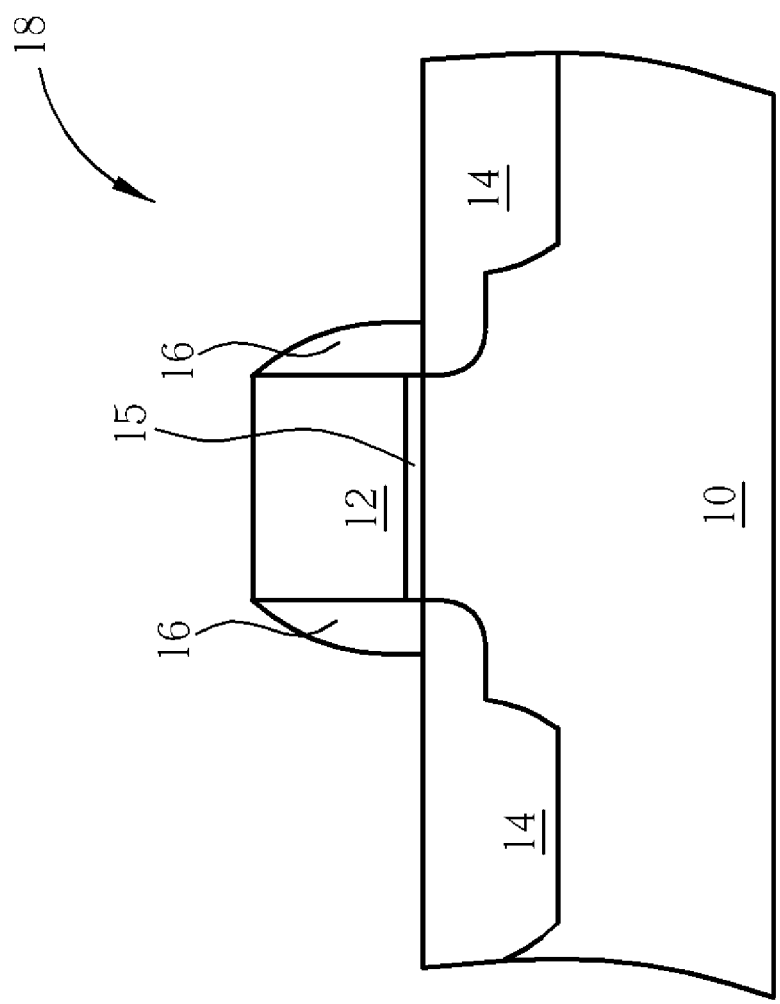
FIG. 1A illustrates a schematic diagram of a prior art metal oxide semiconductor transistor.
Figure 1B:
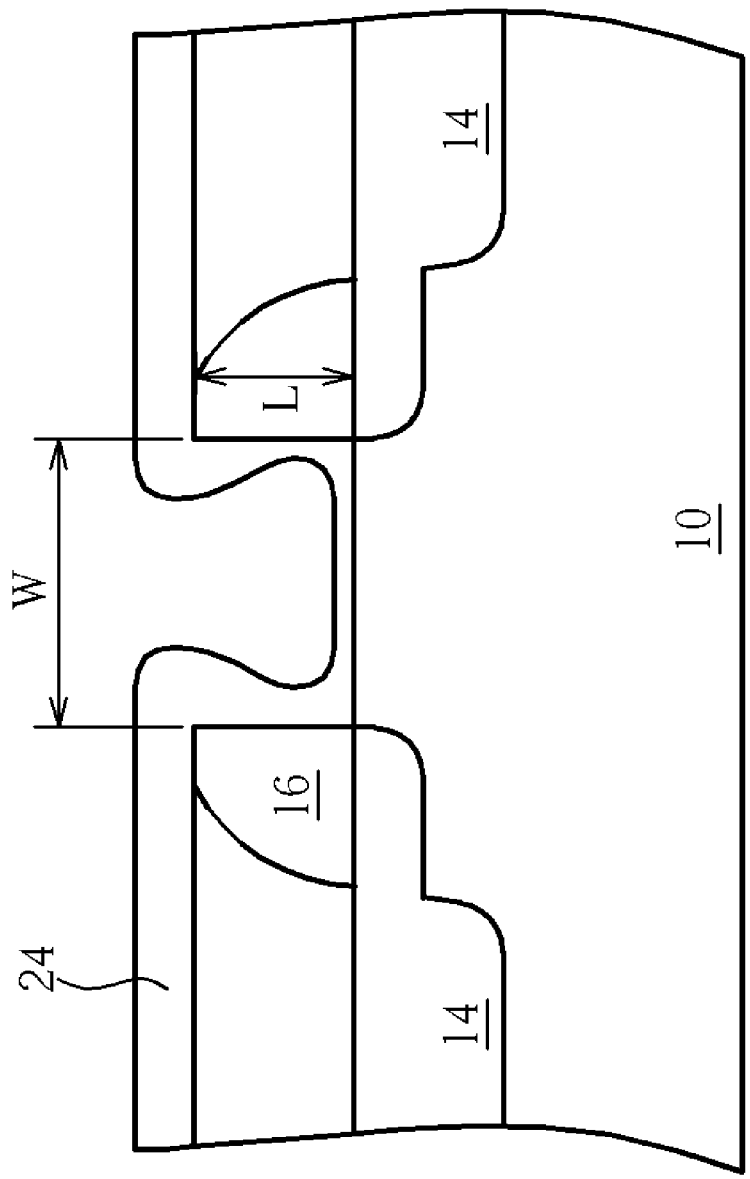
Figure 1C:
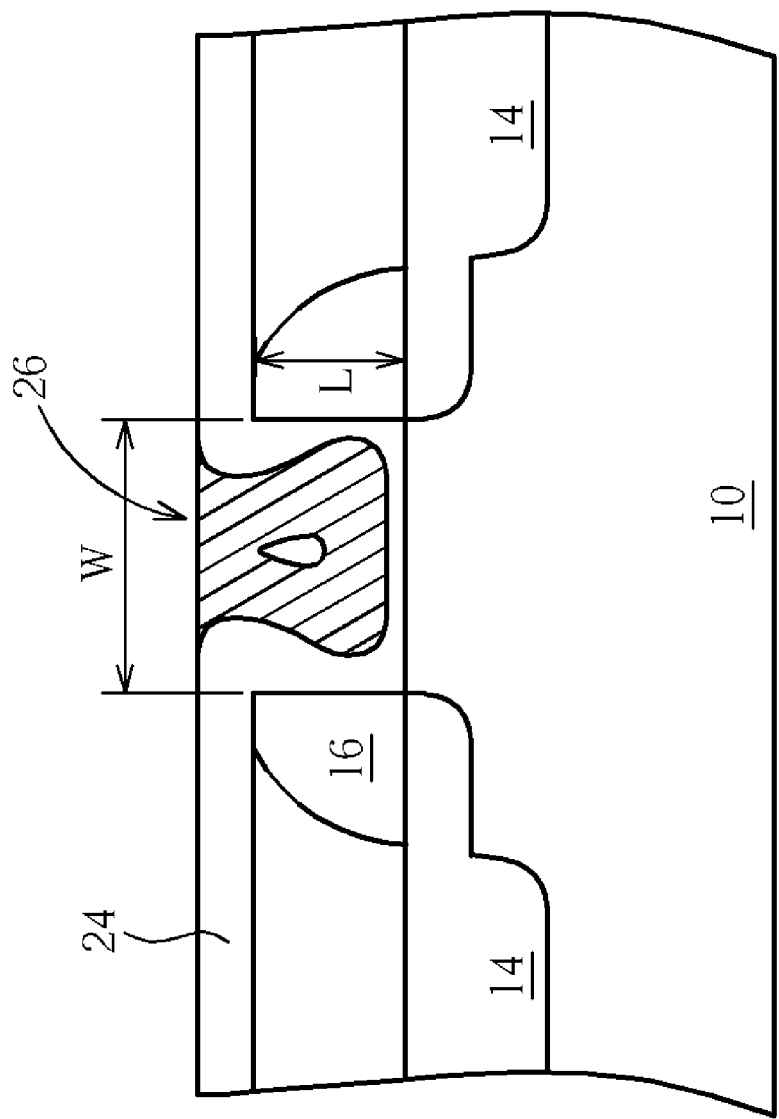
Figure 2:
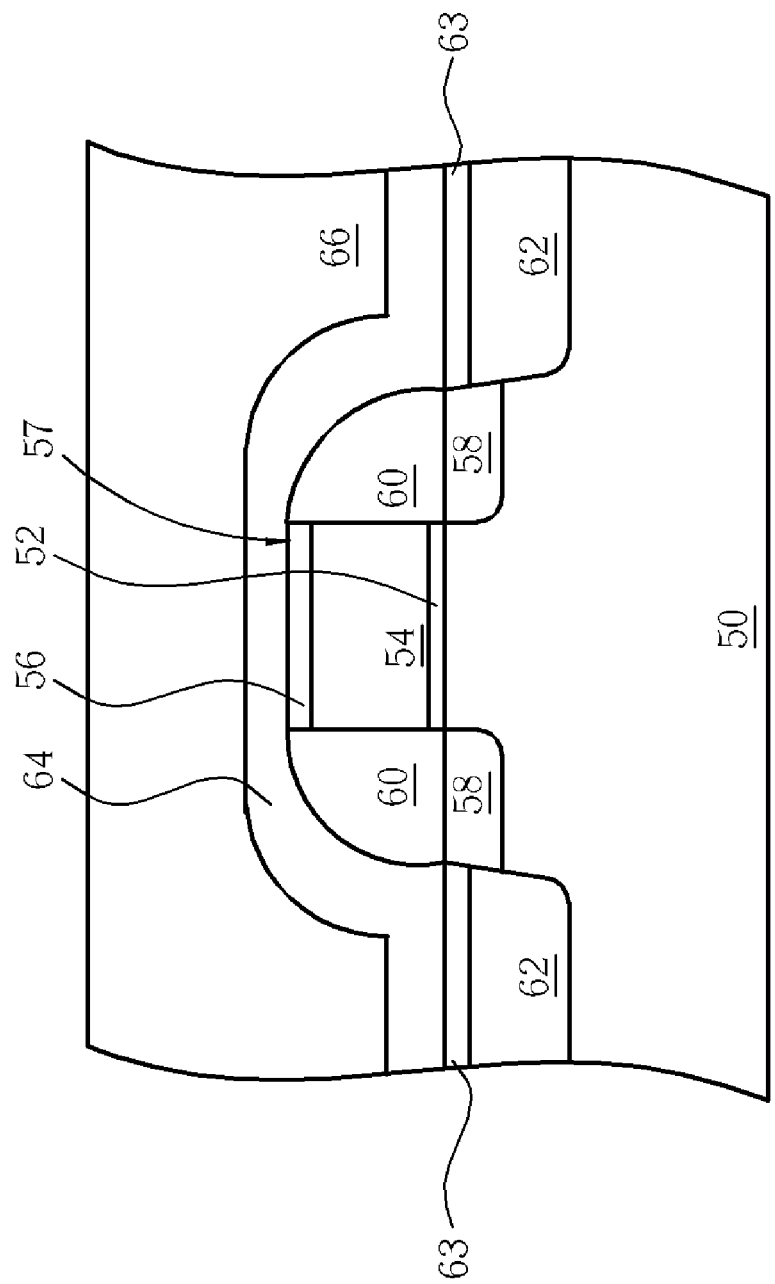
FIGS. 2 to 6 are schematic diagrams of the manufacturing method of a replacement gate according to a first embodiment of the present invention.

Please refer to FIGS. 2 to 6. FIGS. 2 to 6 are schematic diagrams of the manufacturing method of a replacement gate according to a first embodiment of the present invention. As FIG. 2 shows, a substrate 50 has a gate structure 57 thereof. The gate structure 57 includes a gate insulating layer 52, a gate temporary layer 54, and a cap layer 56. The substrate 50 is made from semiconductor materials, such as silicon substrate, Si-containing substrate, or silicon-on-insulator (SOI). The gate insulating layer 52 is made from insulating materials including oxygen or nitrogen or oxygen/nitrogen components, such as oxide, oxy-nitride etc. Otherwise, the gate temporary layer 54 is made by poly-silicon in the first embodiment. The cap layer 56 can comprise oxide layer, oxy-nitride layer, or nitride layer in the first embodiment.

The lightly doped drains 58 (LDDs, also called lightly doped sources) and source/drain dopants 62 are formed in two sides of the gate structure 57 in the substrate 50. Furthermore, the silicide 63 is formed in the surfaces of the source/drain 62 depending on the process requirements and the component characteristics. Furthermore, a spacer 60 made by silicon nitride, or silicon oxide, or silicon nitride/silicon oxide compound material is formed around the gate structure 57. A contact etch stop layer (CESL) 64 covers the gate structure 57, the silicide 63, the spacer 60 and the substrate 50. The purpose of forming the CESL 64 is not only for utilizing it as an etch stop layer of the continuous contact hole etch process, but also for generating compressive or tensile stress for forming a strained structure in the channel between the source/drain 62 under the gate structure 57, so the hole or electron moving speed will increase in the channel. Furthermore, an inter-level dielectric (ILD) layer 66 covers the CESL 64. The CESL 64 can comprise a insulating layer, such as a silicon nitride layer, or a silicon nitride layer with carbon or fluorine doped, and the ILD layer 66 is made by silicon oxide, or doped silicon oxide comprising phosphosilicate glass (PSG) or borophosposilicate glass (BPSG).

Figure 3:
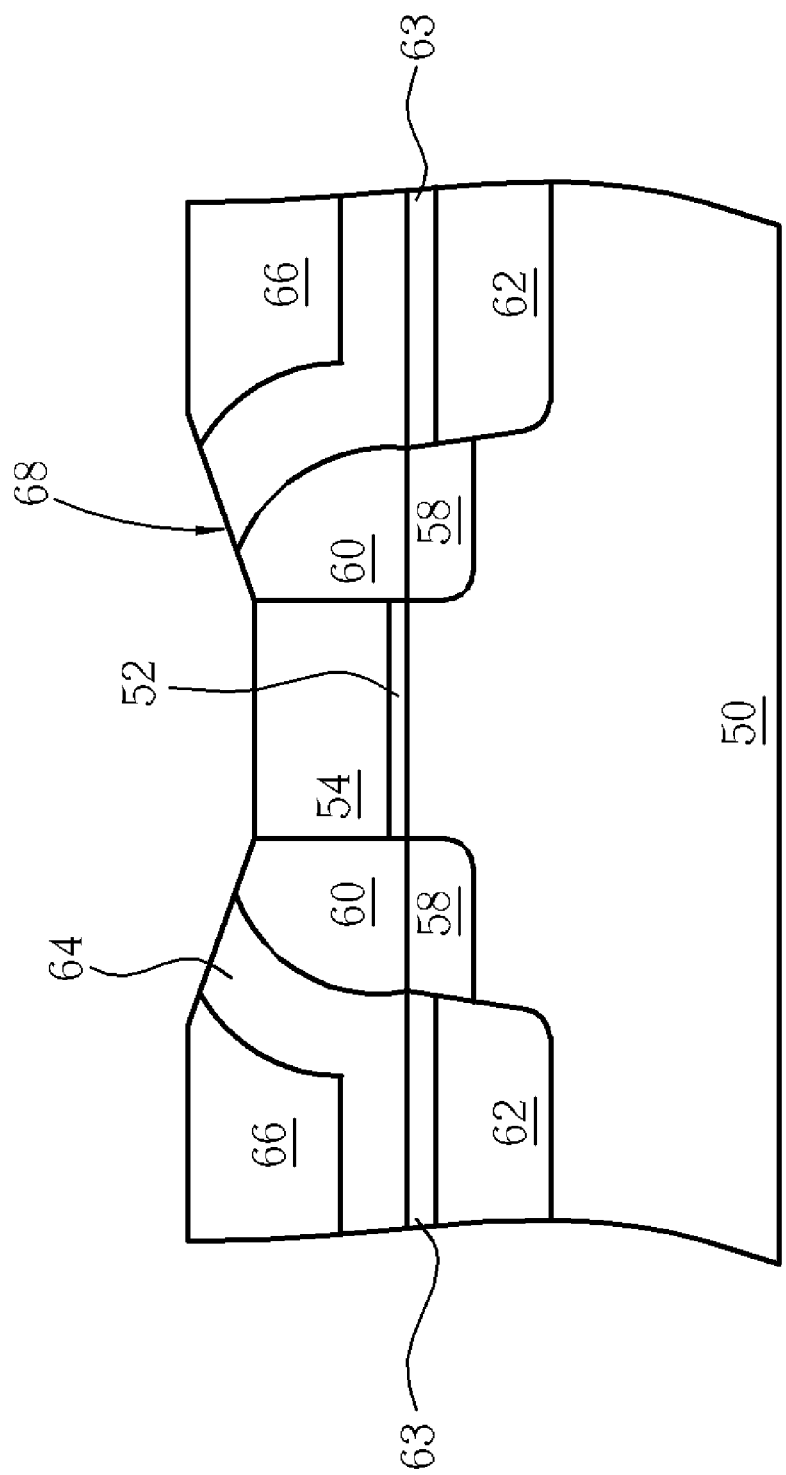

Please refer to FIG. 3. Next, a planarity process comprising chemical mechanical polishing (CMP) process and an etching process are performed to expose the gate temporary layer 54. For example, a CMP process removes the ILD layer 66 until the CESL 64 is exposed, and the CESL 64 is the polishing stop layer for the CMP process. Of course, the CMP process could also partially remove the ILD layer 66 to remain portion of the ILD layer 66 on the CESL 64. Next, an etching process is performed so the CESL 64 on the gate temporary layer 54 is removed, and a bevel edge 68 is formed covering the remains of the ILD layer 66, the CESL 64 and the spacer 60. In this embodiment, the bevel edge 68 is substantially disposed on the ILD layer 66, the CESL 64 and the spacer 60 around the gate temporary layer 54. However, the size, the position and the slant angle of the bevel edge 68 should not be limited. In anther embodiment of the present invention, the bevel edge 68 can be merely disposed on the CESL 64 and the spacer 60 around the gate temporary layer 54, and not cover the ILD layer 66.

In the above-mentioned embodiment, the etching process to form the bevel edge 68 is achieved by a wet etching process or a dry etching process. The wet etching process utilizes a wet etching solution, which has high etching selectivity between the silicon nitride and the oxide, such as a phosphoric acid solution, to remove the CESL 64 made by the silicon nitride. The wet etching is an isotropic etching, and it not only etches in a vertical direction, but also etches in a crosswise direction. Moreover, the speed of etching the ILD layer 66 near the CESL 64 is slower than the speed of etching the CESL 64, so the bevel edge 68 is formed naturally.

The dry etching process forms the bevel edge 68 utilizing a dry etching gas, which has high etching selectivity between the silicon nitride and the oxide, such as a mixed gas including chlorine, hexafluoroethane, and hydrogen bromide. It could etch the CESL 64, and a portion of ILD layer 66 to form the bevel edge 68. No matter whether the bevel edge is formed by the dry or wet etching process, the cap layer 56 can be removed by adjusting the etching recipe.

Figure 4:
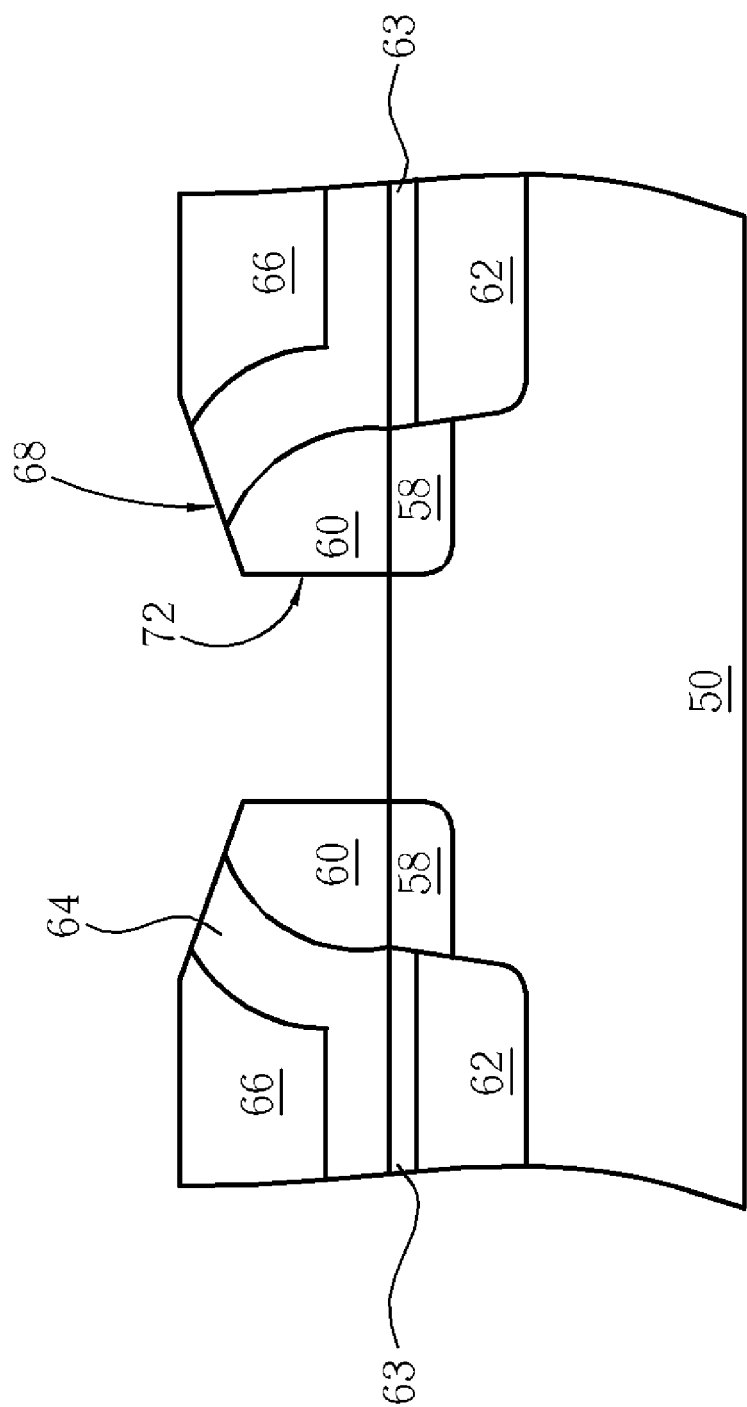

Please refer to FIG. 4. After the bevel edge 68 is finished and the cap layer 56 is removed, a recess 72 is formed by an etching process to remove the gate temporary layer 54 and the gate insulating layer 52. The substantially vertical sidewalls of the spacer 60 surround the recess 72, and the bottom of the recess 72 is the substrate 50. The etching process to remove the gate temporary layer 54 could utilize the wet etching process or the dry etching process. If the wet etching process is utilized, a chemical etching solution, which is made by nitric acid and hydrogen-fluoride acid, can be utilized as the etching solution. If the dry etching process is utilized, a gas made by chlorine or hydrogen bromide can be utilized to remove the gate temporary layer 54. Please note that the material of the gate temporary layer 54 is not limited to poly-silicon, any material having appropriate etching selectivity from the gate insulating layer 52 can be utilized. The gate insulating layer 52 is subsequently removed by the etching process comprising dry etching and wet etching method. The etching process can be implemented prior to the final gate dielectric layer formation such as the pre-clean step by the wet etching chemical solution comprising hydrogen-fluoride acid.

Figure 5:
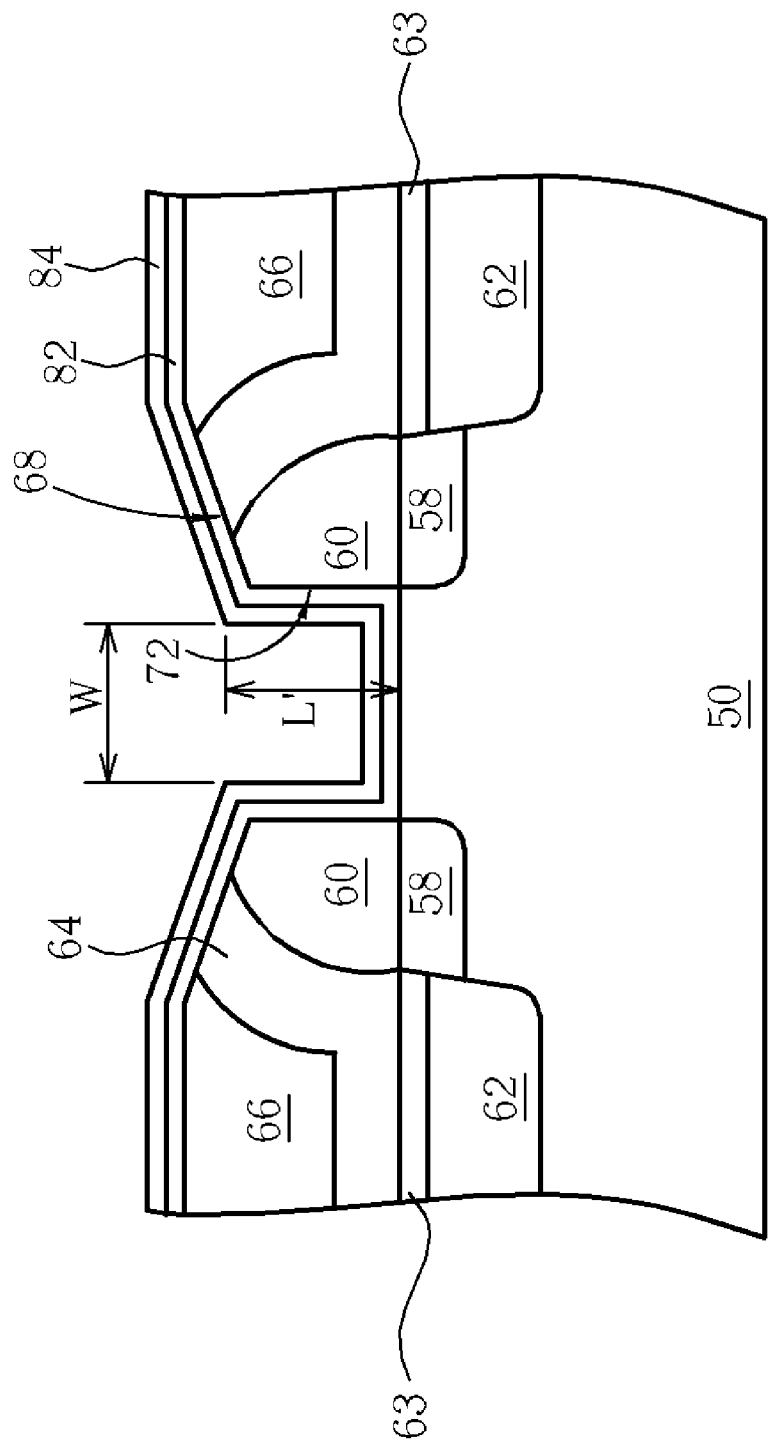

Please refer to FIG. 5. A chemical vapor deposition process or other deposition process is performed to form a high dielectric constant (High-k) material layer 82 in the inter sidewall of the recess 72, and on the bevel edge 68 and the ILD layer 66. The High-k material layer 82 is selected from a group of metal comprising refractory, noble, and rear-earth series elements such as hafnium (Hf) and their aluminates and silicates and nitrogen incorporated in their aluminates and silicates such as HfSiON, Gd2O3, Dy2O3. Prior to the High-k materials layer 82 formation, an interfacial layer (not shown) comprising SiON, Si3N4 or SiO2 is formed between High-k material layer 82 and the substrate 50. After the High-k material layer 82 is formed, a barrier layer 84 is formed on the High-k material layer 82 surface. The forming method of the barrier layer 84 includes atomic layer deposition (ALD), chemical vapor deposition (CVD), or physical vapor deposition (PVD). The barrier layer 84 material could be selected from a group of metal comprising refractory, noble, and lanthanide series elements such as Ti, Ta, Mo, Ru, and W and their aluminates and silicates and nitrogen or carbon incorporated, such as TiN, TaN, TaSiN, TaC, MoAlN, . . . etc. Some of the barrier layer 84 has the work function adjustment properties for threshold voltage tuning. In the first embodiment, for those barrier layer 84 without work function adjustment properties, a work function adjusting layer (not shown) is formed on the barrier layer 84. The work function adjusting layer (not shown) is made from a material containing metal, like ruthenium (Ru).

As the bevel edge 68 is formed on the recess 72 around the first embodiment, and the opening of the recess 72 is wider in the first embodiment, the effective depth/width (L'/W) ratio of the recess 72 is therefore decreased. In addition, when the High-k material layer 82 and the barrier layer 84 are formed in the recess 72, the barrier layer 84 will have better step coverage and won't cause the overhang issue.

Figure 6:
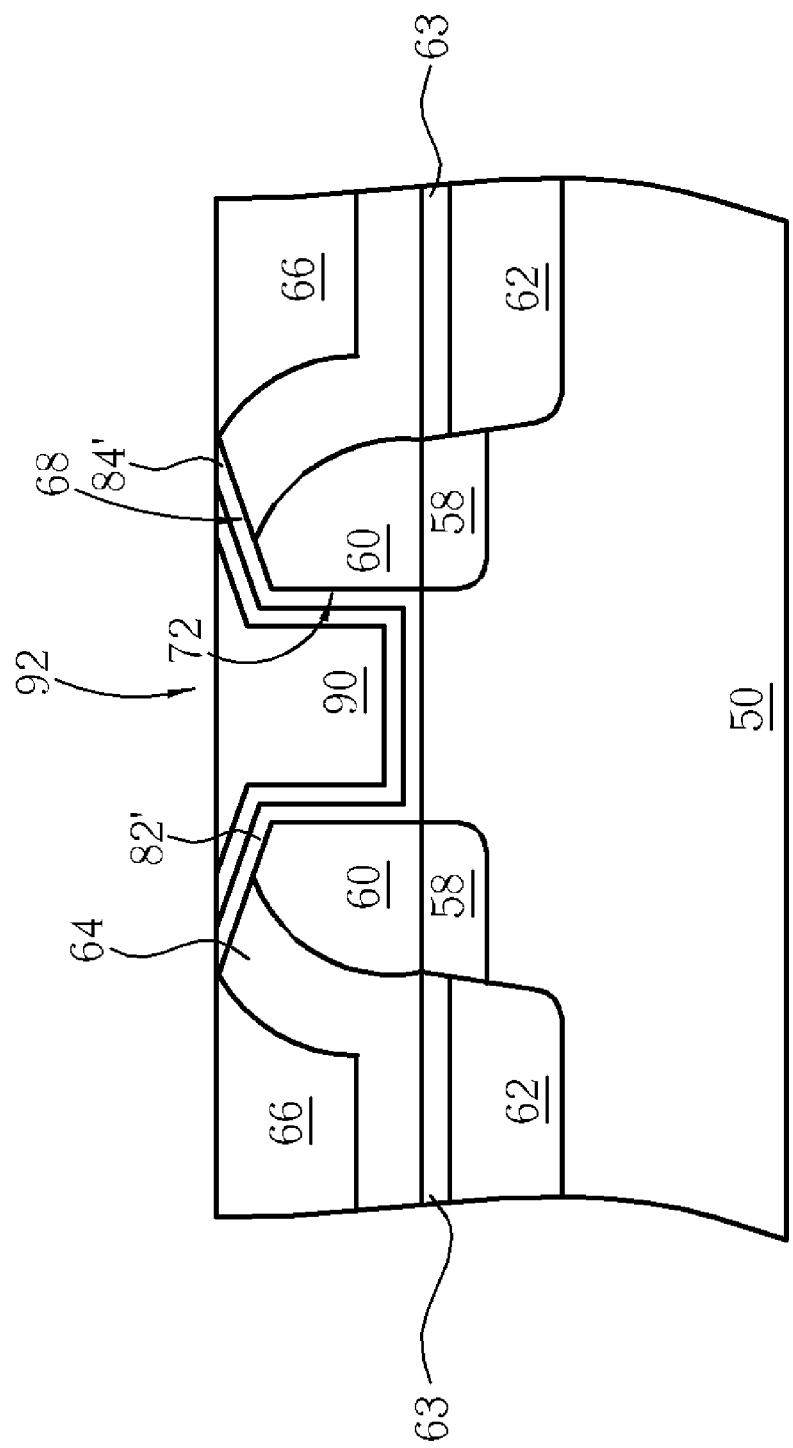

Please refer to FIG. 6. After the barrier layer 84 is formed, a conductive layer (not shown) is formed on the ILD layer 66 and the bevel edge 68, where the recess 72 is filled with the conductive layer. The conductive layer (not shown) is made by a metal material or compound comprising tungsten (W), titanium nitride (TiN), and titanium tungsten (TiW), . . . etc. The conductive layer (not shown), barrier layer 84 and High-k material layer 82 are then processed by a planarity process comprising CMP to expose the remaining ILD layer 66. The metal gate 92 is formed and consists of the remaining High-k materials layer 82', the remaining barrier layer 84', and the remaining conductive layer 90 in the recess 72 and the bevel edge 68. In the first embodiment, the metal gate 92 fills the recess 72 and the bevel edge 68, so the cross-section of the metal gate 92 has a Y structure. The metal gate 92 and the source/drain 62 form the metal-oxide semiconductor transistor. Afterwards, a dielectric layer is deposited and the demand interconnects are formed in sequence to finish the manufacture of the semiconductor component.

Otherwise, in a modification of the first embodiment, when the ILD layer 66 of FIG. 2 is removed to expose the CESL 64, an ion bombardment process is performed to remove the gate temporary layer 54 and the exposed CESL 64. A bevel edge 68 is formed covering the remaining ILD layer 66, the CESL 64 and the gate temporary layer 54. When the ion bombardment process is performed to remove the CESL 64, a dry etching process is performed at the same time to remove cap layer 56, and then the recipe of the dry etching process is adjusted to remove the gate temporary layer 54 and the gate insulating layer 52 to form the recess 72. In other words, the first embodiment could perform the ion bombardment process and the dry etching process at the same time and individually forms the bevel edge 68 and the recess 72. Afterwards, the High-k material layer 82 and the barrier layer 84 are formed in sequence, and the metal gate 92 is thereafter formed as illustrated in the first embodiment. The detailed description of the manufacturing method is omitted here for brevity.

Figure 7:
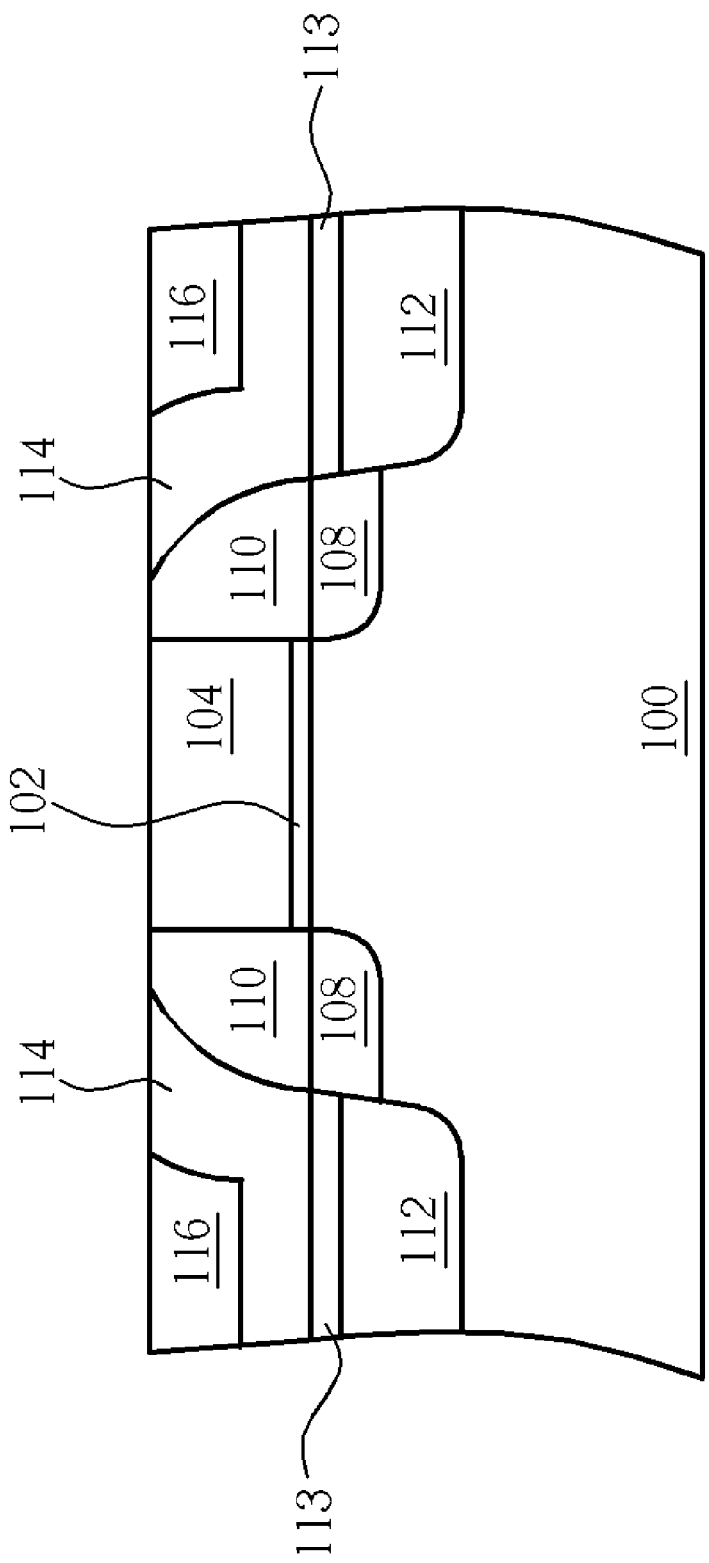
FIGS. 7 to 10 are schematic diagrams of the manufacturing method of a replacement gate according to a second embodiment of the present invention.

Please refer to FIGS. 7 to 10. FIGS. 7 to 10 are schematic diagrams of the manufacturing method of a replacement gate according to a second embodiment of the present invention. As FIG. 7 shows, a substrate 100 has a gate insulating layer 102, a gate temporary layer 104, and a cap layer (not shown). The substrate 100 is made from semiconductor materials, such as silicon substrate or silicon-on-insulator (SOI). The gate insulating layer 102 is made from insulating materials having oxygen or nitrogen or oxygen/nitrogen components, such as oxide, oxy-nitride etc. Otherwise, the gate temporary layer 104 is made by poly-silicon in the second embodiment.

The lightly doped drains 108 and source/drain 112 are formed in the substrate 100 on two sides of the gate insulating layer 102 and the gate temporary layer 104. Furthermore, the source/drain 112 has the silicide 113, and a silicon nitride spacer 110 surrounds the gate insulating layer 102 and the gate temporary layer 104.

An insulating CESL 114 covers the gate temporary layer 104, the spacer 110 and the substrate 100. An ILD layer 116 covers the CESL 114. The CESL 114 can comprise a insulating layer, such as a silicon nitride layer, or a silicon nitride layer with carbon or fluorine doped, and the ILD layer 116 comprises silicon oxide, or doped silicon oxide comprising boron or phosphorous. Afterwards, the CMP process and the etching process are performed to expose the gate temporary layer 104. For example, a CMP process removes the partial ILD layer 116 firstly, and the etching back process is then performed to remove a part of the remaining ILD 116 to expose the CESL 114. Next, the etching recipe is adjusted to remove the cap layer (not shown) and the CESL 114 positioned on the gate temporary layer 104 until the poly-silicon gate temporary layer 104 is exposed.

Figure 8:
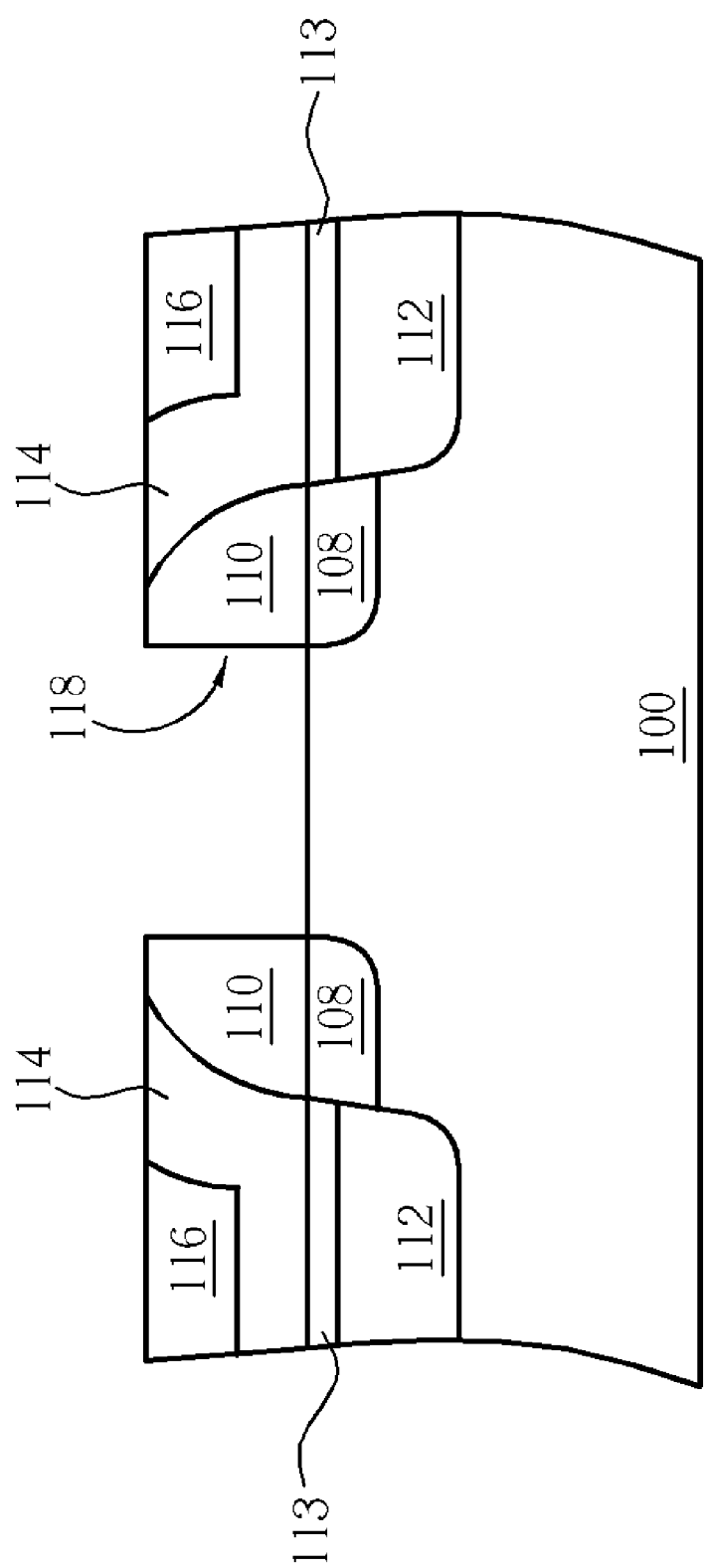

Next, please refer to FIG. 8. A recess 118 is formed by an etching process to remove the gate temporary layer 104 and the gate insulating layer 102. The substantially vertical sidewalls of the spacer 110 surround the recess 118, and the bottom of the recess 118 is the substrate 100. The etching process to remove the gate temporary layer 104 could be the wet etching process or the dry etching process. If the wet etching process is utilized, a chemical etching solution, which is made by nitric acid and the hydrogen-fluoride could be utilized as the etching solution. If the dry etching process is utilized, a gas made by chlorine or hydrogen bromide could be utilized to remove the gate temporary layer 104. Please note that the materials of the gate temporary layer 104 are not limited to poly-silicon, any material having appropriate etching selectivity from the gate insulating layer 102 can be utilized. The gate insulating layer 102 is subsequently removed by the etching process comprising dry etching and wet etching method. The etching process can be implemented prior to the final gate dielectric layer formation such as the pre-clean step by the wet etching chemical solution comprising hydrogen-fluoride acid.

Figure 9:
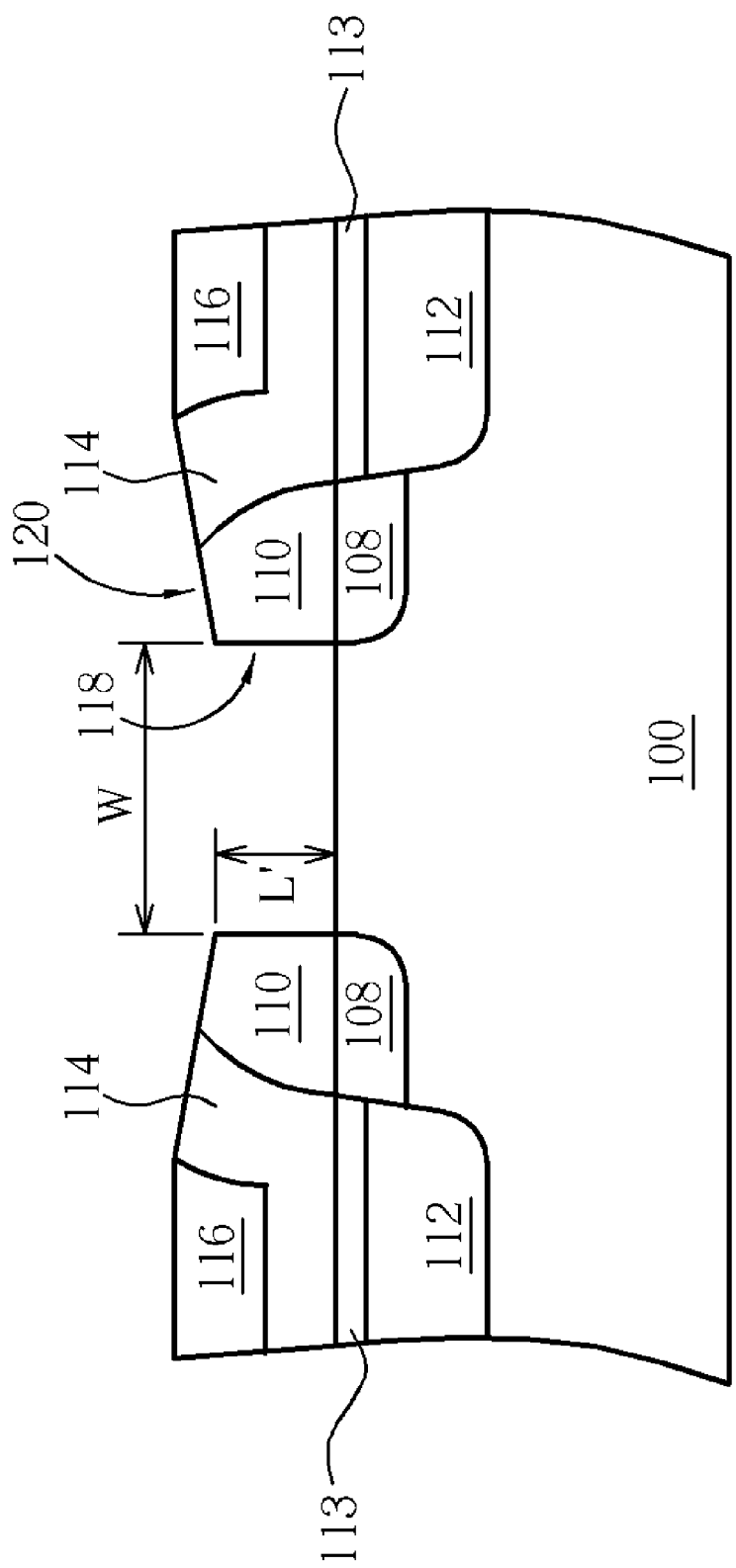

Please refer to FIG. 9. An ion bombardment process or an etching process is performed on the opening of the recess 118. The portion of the spacer 110 around the recess 118 opening and the portion of the CESL 114 are removed to form a bevel edge 120. Since the bevel edge 120 is formed around the recess 118, the effective depth/width (L'/W) ratio of the recess 118 can be decreased.

Figure 10:
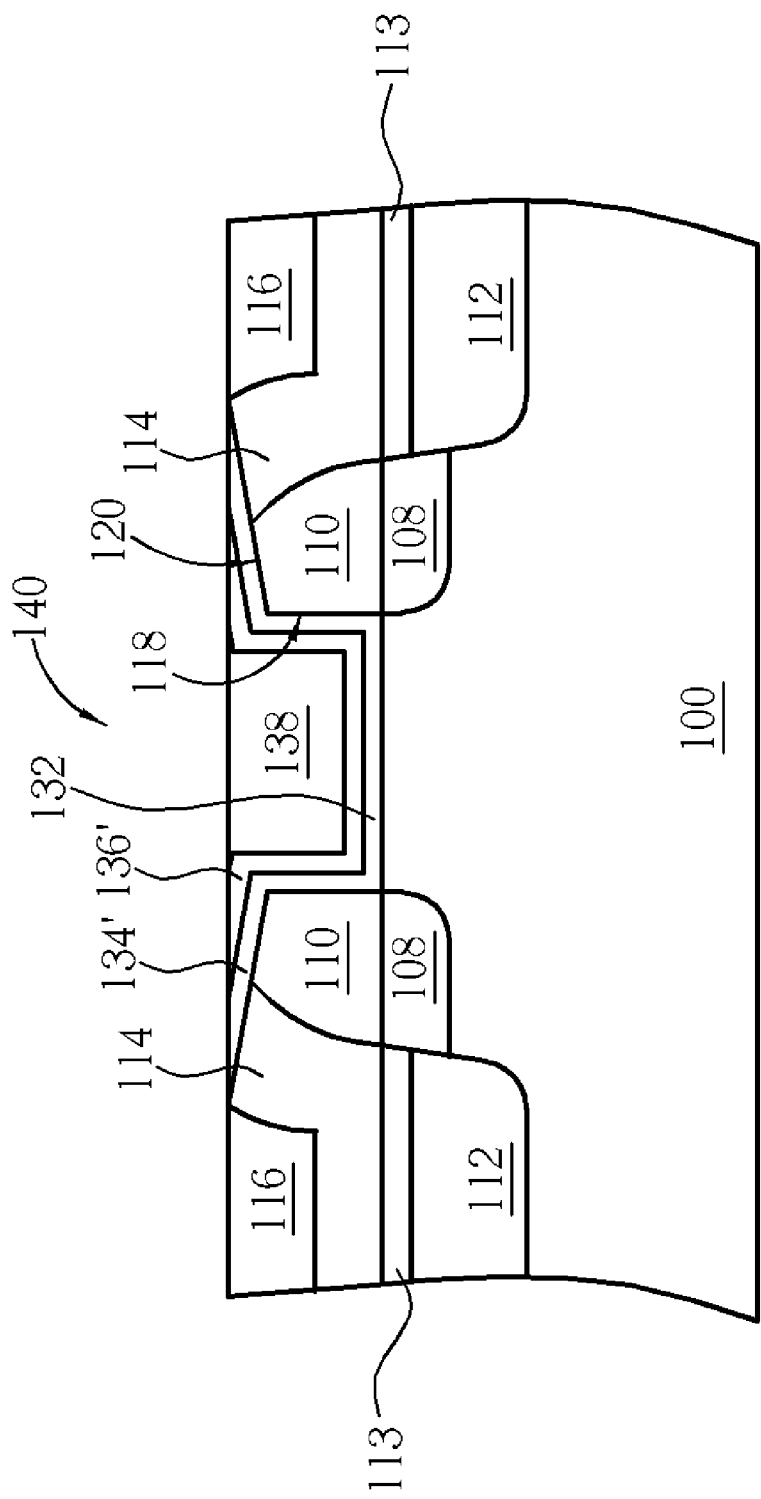

Please refer to FIG. 10. A gate dielectric layer 132 is formed in the bottom of the recess 118 and on the substrate 100. The gate dielectric layer 132 is formed by an oxidation comprising thermal and chemical processes. The silicon substrate 100 is oxidized to form the gate dielectric layer 132 in the recess 118. Next, a High-k material layer (not shown in the figure) is formed entirely in the recess 118, on the bevel edge 120, and on the remaining ILD 116. After the High-k material layer is deposited, a barrier layer (not shown) is formed on the surface of the High-k material layer. After the barrier layer is formed, a conductive layer (not shown) is formed on the ILD 116 and the bevel edge 120, and the recess 118 is filled with the conductive layer (not shown). Thereafter, a CMP process is carried out on the conductive layer (not shown) to expose the remaining ILD 116, the remaining High-k material layer 134' and the remaining conductive layer 136'. The remaining metal material 138, the remaining barrier layer 136' and the remaining High-k material layer 134' positioned in the recess 118 and on the bevel edge 120 can form a metal gate 140. Afterwards, a dielectric layer is deposited and the demand interconnects are formed in sequence, to complete the manufacture of the semiconductor component.

The forming method of the High-k material layer includes ALD, chemical vapor deposition (CVD), or physical vapor deposition (PVD). The High-k dielectric material is selected from a group of metal comprising refractory, noble, and rear-earth series elements such as hafnium (Hf) and their aluminates and silicates and nitrogen incorporated in their aluminates and silicates such as HfSiON. The forming method of the barrier layer includes ALD, chemical vapor deposition, or physical vapor deposition. The material of the barrier layer is selected from a group of metal comprising refractory, noble, and rear-earth series elements such as Ti, Ta, Mo, Ru, and W and their aluminates and silicates and nitrogen or carbon incorporated such as TiN, TaN, TaSiN, TaC, MoAlN, . . . etc. Some of the barrier layer 136 has the work function adjustment properties for threshold voltage tuning. In the second embodiment, for the barrier layer without work function adjustment properties, a work function adjusting layer is formed on the barrier layer 136. The work function adjusting layer is made from a material containing metal, like ruthenium (Ru).

As the bevel edge 120 is formed around the recess 118 in the second embodiment, the effective depth/width (L'/W) of the recess 118 decreases as in the second embodiment. When the High-k material layer 134 and the barrier layer 136 are formed, the barrier layer 136 will have the better step coverage. The conductive layer is made by a metal material comprises tungsten (W), titanium nitride (TiN), and titanium tungsten (TiW). In the second embodiment, the metal gate 138 fills the recess 118 and the bevel edge 120, so the cross-section of the metal gate 138 has a Y structure. The metal gate 138 and the source/drain 112 form the metal-oxide semiconductor transistor.

When the barrier layer of the present invention is formed in the recess, the barrier layer will have the better step coverage than the prior art, because the recess opening has the bevel edge and the depth/width is less than the prior art. Accordingly, the metal gate filling the recess can have a better structure for manufacturing a good quality metal oxide semiconductor transistor with a metal gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a metal oxide semiconductor transistor with a metal gate, comprising:
    providing a substrate, a gate temporary layer formed on the substrate, a spacer surrounding the gate temporary layer, the substrate having two doping regions on two sides of the gate temporary layer respectively;
    forming an insulating layer on the gate temporary layer, the spacer and the substrate forming a dielectric layer on the insulating layer;
    removing the partial dielectric layer to expose the insulating layer;
    removing the gate temporary layer and the insulating layer positioned on the gate temporary layer, and forming a bevel edge and a recess, the bevel edge covering the spacer, and the recess being surrounded by the spacer;
    forming a barrier layer covering the inner sidewall of the recess, the bevel edge and the remaining dielectric layer;
    forming a conductive layer in the recess, and on the bevel edge and the remaining dielectric layer; and
    removing the barrier layer and the conductive layer positioned on the remaining dielectric layer to form a metal gate.

2. The method of claim 1, wherein the step of removing the partial dielectric layer to expose the insulating layer utilizes either a chemical mechanical polishing process, an etching process, or a combination of the chemical mechanical polishing process and etching process.

3. The method of claim 1, wherein the insulating layer and the dielectric layer, and the gate temporary layer and the spacer have high etching selectivity.

4. The method of claim 1, wherein the step of forming the bevel edge is an ion bombard process, and the step of forming the recess is a dry etching process, and the two steps are performed at the same time.

5. The method of claim 1, wherein the steps of forming the bevel edge and forming the recess are processed in the same instrument.

6. The method of claim 1, wherein the recess is formed after the step of forming the bevel edge.

7. The method of claim 6, wherein the step of forming the bevel edge utilizes either a dry etching process or a wet etching process.

8. The method of claim 6, wherein the step of forming the recess utilizes either a dry etching process or a wet etching process.

9. The method of claim 1, wherein the bevel edge is formed after the step of forming the recess.

10. The method of claim 9, wherein the step of forming the recess utilizes either a dry etching process or a wet etching process.

11. The method of claim 9, wherein the step of forming the bevel edge is an ion bombard process.

12. The method of claim 1, wherein the insulating layer comprises a silicon nitride layer, the dielectric layer comprises an oxide layer, and the gate temporary layer comprises poly-silicon.

13. The method of claim 1, wherein the insulating layer comprises a carbon or fluorine incorporated silicon-containing layer.

14. The method of claim 1, further comprising:
    forming a high k material layer in the inner sidewall of the recess, on the bevel edge, and the remaining dielectric layer prior to the barrier layer formation.

15. The method of claim 1, further comprising:
    forming a work function adjusting layer on the barrier layer after the barrier layer is formed.

16. The method of claim 1, wherein the step of removing the barrier layer and the conductive layer on the remaining dielectric layer utilizes a chemical mechanical polishing process.

* * * * *